United States Patent [19]

Davis et al.

[11] Patent Number: 4,788,125
[45] Date of Patent: Nov. 29, 1988

[54] IMAGING MATERIALS EMPLOYING MICROPARTICLES INCLUDING A SILVER INITIATOR

[75] Inventors: Paul D. Davis, Centerville; Joseph G. O'Connor, Springboro, both of Ohio

[73] Assignee: The Mead Corporation, Dayton, Ohio

[21] Appl. No.: 46,380

[22] Filed: May 4, 1987

Related U.S. Application Data

[63] Continuation-in-part of Ser. No. 800,008, Nov. 20, 1986, abandoned.

[51] Int. Cl.$^4$ .......................... G03C 1/40; G03C 1/00
[52] U.S. Cl. .................................... 430/138; 430/531; 430/532; 430/536; 430/617; 430/618; 430/619; 430/620; 430/935
[58] Field of Search ............... 430/138, 617, 618, 619, 430/620, 531, 532, 536, 935

[56] References Cited

U.S. PATENT DOCUMENTS

| | | | |
|---|---|---|---|
| 3,219,446 | 11/1965 | Berman | 430/138 |
| 3,347,676 | 10/1967 | Cripps | 96/115 |
| 3,915,704 | 10/1975 | Limburg et al. | 96/27 |
| 3,984,253 | 10/1976 | Nelson | 96/35.1 |
| 4,108,839 | 8/1978 | Chambers et al. | 538/270 |
| 4,399,209 | 8/1983 | Sanders et al. | 430/138 |
| 4,440,846 | 4/1984 | Sanders et al. | 430/138 |
| 4,504,575 | 3/1985 | Lee | 430/531 |

FOREIGN PATENT DOCUMENTS 34488 4/1977 Japan.

OTHER PUBLICATIONS

"Chemical Amplification in the Design of Dry Developing Resist Materials", Ito et al., Polymer Engineering and Science, Dec. 1983, vol. 23, No. 18.

Primary Examiner—Mukund J. Shah
Attorney, Agent, or Firm—Smith & Schnacke

[57] ABSTRACT

An imaging material comprising a support and a layer of photosensitive microparticles on one surface of said support, said microparticles including an image-forming agent and a photosensitive composition containing a polymer which is capable of undergoing cationically-initiated depolymerization and a photoinitiator including a silver halide and an organo silver salt, wherein, after exposing said microparticle to radiation, said microparticles, directly or with additional processing, release said image-forming agent or become permeable to a developer which reacts with said image-forming agent to form a visible image.

10 Claims, 3 Drawing Sheets

IMAGING MATERIALS EMPLOYING MICROPARTICLES INCLUDING A SILVER INITIATOR

CROSS-REFERENCE TO RELATED APPLICATIONS

This application is related to Ser. No. 024,292 entitled "Imaging Material Employing Microparticles," filed on Mar. 10, 1987, and is a continuation-in-part of U.S. application Ser. No. 800,088, filed Nov. 20, 1986, now abandoned.

BACKGROUND OF THE INVENTION

The present invention relates to an imaging system which is capable of forming monochromatic or full color images; it is more particularly related to an imaging system employing photosensitive microparticles containing an image-forming agent in which exposure of the microparticles to actinic radiation controls the release of the image-forming agent from the particles or its reaction with a developer.

Imaging systems employing photosensitive microcapsules are known in the art. An early version of these systems is described in U.S. Pat. No. 3,219,446 to Berman. More recently, Sanders et al. have described an imaging system in U.S. Pat. Nos. 4,399,209 and 4,440,846 in which a chromogenic material is encapsulated with a photohardenable or photosoftenable composition. In this system, the microcapsules are image-wise exposed to actinic radiation and subjected to a uniform rupturing force whereupon they image-wise release a chromogenic material which reacts with a developer to form a full color or a monochromatic image. Japanese Patent Publication No. 34488/1977 also discloses a photosensitive material including microcapsules. Therein, a chromogenic material is encapsulated in a wall material containing a photosensitive substance which generates a gas by photodecomposition. Upon exposure, the microcapsules release the chromogenic material whereupon it reacts with a developer, which is present in the microcapsule layer, to form the image.

SUMMARY OF THE INVENTION

The present invention provides an imaging material which comprises a support having a layer of photosensitive microparticles on the surface which contain an imageforming agent. The microparticles are formed from a photosensitive composition containing a depolymerizable polymer which has an image-forming agent admixed therewith. The microparticles are designed such that they release the image-forming agent or permit the image-forming agent to react with a developer if they are exposed to actinic radiation. In one embodiment of the invention, the image-forming agent is a chromogenic material and a developer material is associated with the photosensitive material such that, after exposure, the chromogenic material reacts with the developer and forms a visible image.

The photosensitive material of the present invention is advantageous because it is a negative-working material. It is only necessary to expose the material to radiation in the areas in which an image is desired, i.e., the image areas. Non-image or background areas in which no color is desired remain white in the absence of exposure. These materials are particularly advantageous for imaging by laser scanners and the like, because the scanner can pass over the non-image areas. By contrast, the most typical of the photosensitive materials described in the aforementioned Sanders' patents employ photohardenable compositions. These materials are positive-working. To achieve Dmin, they must be fully exposed in the non-image areas in order to lock the chromogenic material in the capsule and prevent its reaction with the color developer. These materials are not desirable for use with scanning-type exposure devices because both image and non-image areas must be exposed. The image areas require exposure to the extent that only a partial release of the chromogenic material in the image areas is desired. The non-image areas require a full exposure to achieve Dmin. Furthermore, the photohardenable compositions which have been developed for use in the Sanders' materials have comparatively low sensitivity. As a consequence of the need to fully expose a large area of the photosensitive material and the comparatively low sensitivity of the photohardenable compositions, long exposure periods are required to expose the positive-working embodiment of the Sanders' material using a scanner device.

A further advantage of the photosensitive material of the present invention is its handleability. Because the microparticle is solid, inadvertent release of the image-forming agent in the course of handling is not nearly as likely to occur as it is using photosensitive microcapsules which readily rupture. The photosensitive material of the present invention is also advantageous because it can provide full color images from a single photosensitive layer as contrasted with silver halide materials which include a plurality of layers.

Another advantage of the microparticles of the present invention is their relatively insensitivity to oxygen. In many cases depolymerization is initiated by a photogenerated acid which reacts directly with the depolymerizable polymer. In systems in which imaging occurs via free radical polymerization, the oxygen in the photosensitive composition must be consumed by free radicals before polymerization proceeds. Oxygen does not affect the depolymerization chemistry relied upon in most embodiments of the present invention.

The photosensitive material of the present invention is distinguished from the Sanders' materials and, more particular, Sanders' materials employing photosoftenable compositions, in that the microparticle used herein does not include a microcapsule wall. Furthermore, in accordance with the preferred embodiments of the invention, the microparticles are formed from a photosensitive composition of a polyaldehyde.

In accordance with one embodiment of the present invention, the imaging material is used to form full color images. This can be accomplished two ways. One method is to form full color transfer images using three separate imaging sheets on which the microparticles respectfully contain cyan, magenta, and yellow color-forming chromogenic materials. By sequentially exposing the three sheets and conducting successive transfers in register to an image-receiving sheet carrying a developer material, the cyan, magenta, and yellow color-forming chromogenic materials are image-wise transferred to the surface of the developer sheet where they react to form a full color image.

In another full color photosensitive imaging material in accordance with the present invention, the layer of microparticles includes three, and in some cases four, sets of microparticles. Each set of microparticles contains a different chromogenic material and is selectively sensitive to a different band of actinic radiation. The distinct sets of microparticles respectively contain cyan-, magenta-, and yellow-forming chromogenic materials or cyan-, magenta-, yellow-, and black-forming chromogenic materials. The photosensitive compositions from which the microparticles are formed are designed with distinctly different wavelength sensitivities such that, at selected wavelengths, each set of microparticles can be exposed such that it releases the image-forming agent and/or permits it to react with a developer without cross-exposing the other sets of microparticles.

The latter full color imaging material is advantageous because the microparticles are image-wise exposed on the surface of a single imaging sheet. The visible image can be developed using any of the development techniques described later including one embodiment in which the developer material is present on the same surface of the image sheet as the microparticles and one embodiment in which the developer material is provided on a separate image-receiving sheet. After image-wise exposing the imaging material to actinic radiation sequentially or simultaneously in each of the regions in which the respective sets of microparticles are sensitive, the microparticles image-wise release the chromogenic materials (directly or with additional processing) or otherwise enable the chromogenic material to react with a developer.

Definitions

The term "microparticle" is used herein to define a particle formed from an admixture of an image-forming agent and a photosensitive composition containing a depolymerizable polymer. The term "microparticle" is to be distinguished from the term "microcapsule" which is defined in U.S. Pat. Nos. 4,399,209 and 4,440,846 as a capsule having a discrete capsule wall or an encapsulated dispersion of a photosensitive composition in a binder.

The term "radiation" as used herein includes the full spectrum of electromagnetic radiation including actinic radiation such as ultraviolet, infrared, and visible light, as well as ionizing and particle radiation The term "depolymerizable polymer" as used herein includes polymers which either become depolymerized or decrosslinked in the presence of products generated upon exposing the photosensitive composition to radiation. The polymers themselves may be photosensitive. That is, the polymers may be photolyzable and depolymerize directly upon exposure to radiation. Otherwise, the polymers may be non-photosensitive, in which case another photosensitive species such as a photoinitiator must be present in the photosensitive composition.

DETAILED DESCRIPTION OF THE INVENTION

A photosensitive material in accordance with the present invention, in its simplest form 10, comprises a support 12 and a layer 14 of microparticles 16. The microparticles 16 are formed from a photosensitive composition containing a depolymerizable polymer which is admixed with an image-forming agent as discussed below.

Figure 1:
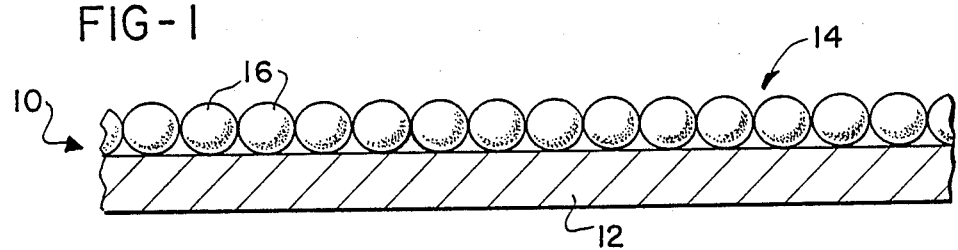
FIG. 1 is a schematic illustration in cross-section of an imaging material in accordance with one embodiment of the present invention.
Figure 2:
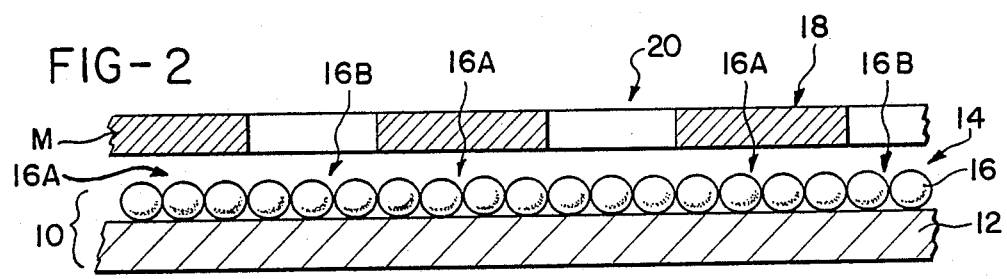
FIG. 2 schematically illustrates image-wise exposure of an imaging material in accordance with the present invention.

In FIG. 2, the photosensitive material 10 is shown being exposed to actinic radiation (designated hλ) through a mask M to form a latent image in the form of unexposed and exposed microparticles 16A and 16B. After exposure, the manner of processing will depend on the nature of the microparticle and the image-forming agent. The microparticles 16A in the unexposed areas 18 are unchanged. The microparticles 16B in the exposed areas 20 undergo a change which enables the image-forming agent to be released or exuded from the microparticle or simply to react with a developer to form a visible image. The change may occur directly upon exposure or, depending upon the composition of the microparticle, the change may occur upon heating, application of pressure, or like treatment.

Images are formed by one of two mechanisms. The image-forming agent may be released from the microparticles or the microparticles may become permeable to a developer material. Where transfer images are formed, the image-forming agent (e.g., a benign dye or a chromogenic compound) must be released from the microparticles. In self-contained systems or systems in which the developer is applied externally, either mechanism is useful.

Figure 3:
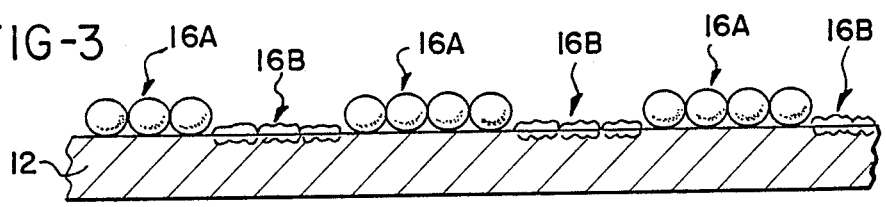
FIG. 3 illustrates an imaging material in accordance with the present invention following exposure or following an optional treatment to cause the exposed microparticles to release the image-forming agent.
Figure 4:
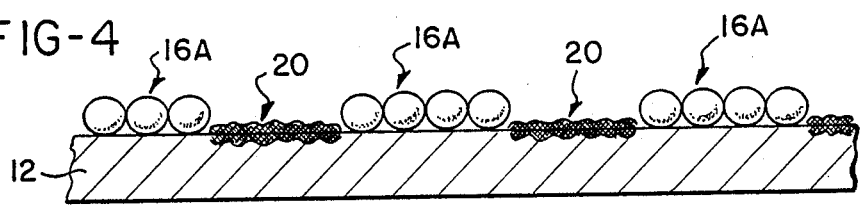
FIG. 4 illustrates a visible image formed in an imaging material in accordance with one embodiment of the present invention.

FIG. 3 represents the photosensitive material 10 after exposure and, in most cases, after an optional step of treating the microparticles to facilitate the release of the image-forming agent or its accessibility to a developer. In FIG. 3, the unexposed microparticles 16A are shown as retaining their original form, whereas, the exposed microparticles 16B are shown as having lost their form. The change in the morphology of microparticles 16B is shown for purposes of illustration only. In fact, there may be no visible change in the exposed microparticles.

Where the image-forming agent is a chromogenic material, that is, a material which becomes colored upon reaction with a developer, it will be necessary to provide a developer. The developer can be provided using a number of techniques depending upon its nature and that of the chromogenic material. The developer may be incorporated into the layer of microparticles or into a contiguous layer to provide a self-contained imaging material. Images can be obtained using this type of material by simply exposing the material to radiation or exposing it to radiation and heating or otherwise inducing the reaction of the chromogenic material and the developer. The developer may penetrate the microparticle or the chromogenic material may exude from the microparticle in this type of development. Color development processing, in accordance with the foregoing embodiment, is illustrated in FIG. 4. There, the image 20 is shown in the area of the exposed microparticle 16B. Where desirable, the developer can be microencapsulated or provided in a separate microparticle.

Another technique that can be used is to provide the developer on a separate support to which the chromogenic material is transferred. Images are formed by contacting the photosensitive material of FIG. 2 or FIG. 3 with the developer sheet such that the image-forming agent transfers to the developer sheet to form the image. In this case, heating and/or pressure can be combined with the transfer step to simultaneously cause the image-forming agent to be released from the microparticle and transfer to the developer sheet.

Alternatively, various external applications of developers can be used. The developing agent can be a gas with which the photosensitive material is contacted. Furthermore, while "dry" development processing (i.e., processing without external application of a developer) is clearly favored, images can also be formed by contacting the photosensitive material of FIG. 3 with a solution of a developer. When the developer is applied externally, the developer may be a common developer which is capable of reacting with all the chromogenic materials, or a combination of developers may be used which respectively reacts with the different chromogenic materials.

In accordance with another embodiment of the invention, a toner may be applied which selectively adheres to the microparticles in the exposed areas.

When the microparticles contain a colored image-forming agent, such as a dye or pigment, transfer may be the only step required to produce the image, i.e., no developer reaction is required. The exposed photosensitive material of FIG. 2 simply may be assembled with a transfer sheet, which could be plain paper or a paper treated to enhance its absorption of the dye or pigment, and transfer effected. In most cases, transfer will be effected simultaneously with the application of pressure and optionally heat to release and transfer the dye or pigment.

Those skilled in the art will appreciate from the foregoing discussion that while the process of the present invention has been illustrated in FIGS. 2-4 as involving separate steps, the development steps need not be performed separately. Indeed, if the microparticle releases the image-forming agent directly upon exposure without additional processing and a developer is incorporated on the surface of the photosensitive material with the microparticle, the steps illustrated in FIGS. 2-4 occur simultaneously. Typically, the steps illustrated in FIGS. 3 and 4 will occur simultaneously.

The microparticles used in the present invention are formed from a photosensitive polymer composition containing a depolymerizable polymer which breaks down upon exposure to radiation, such that an image-forming agent incorporated in the polymer composition can react with a developer or be released from the microparticles. Useful depolymerizable polymers undergo free radical initiated or cationic depolymerization.

Representative examples of photosensitive compositions useful in the present invention are described in U.S. Pat. Nos. 4,108,839; 3,984,253; 3,917,483; 3,915,704 and 3,127,811. These compositions contain polyaldehydes, but other depolymerizable compositions such as compositions containing polycarbonates as disclosed by Crivello, "Applications of Photoinitiated Cationic Polymerization to the Development of New Photoresists," *Polymers in Electronics,* ACS 242, p3 (1984) and Frechet et al., *J. Imaging Science,* 30 (2). p. 59 (1986); compositions containing polyethers ad disclosed by Goethals, E. J., "The Formation of Cyclic Oligomers in the Cationic Polymerization of Heterocyclics," *Adv. Poly. Sci.,* Vol. 23, p. 103; compositions containing poly(olefin sulfones) as disclosed by Hiraoka, H. "Deep U.V. Photolithography with Composite Photoresists Made of Poly(olefin sulfones)," *Polymers in Electronics, ACS* 242, p. 55 (1984); Bowden, M. J., et al., ibid, pg. 135 and 153; and U.S. Pat. No. 3,935,331 to Foliniak et al,; and compositions containing poly(3-oximino-2-butanone methacrylate) or poly(4'-alkyl acylophenones) as disclosed in Reichmanis, E., *Am. Chem. Soc. Div. Orq. Coat. Plast. Chem. Prepr.,* 1980, 43, 243–251 and Lukac, I., Chmela, S., *Int Conf. on Modif. Polym.* 5th Bratislave, Czech., July 3–6, 1979, I.U.P.A.C. Oxford, England 1979, 1, 176–182) may be also be useful. Polysulfones of the type used in thermal transfer systems are also potentially useful.

Other potentially useful depolymerizable systems are the metal-crosslinked polymeric gels described in U.S. Pat. No. 3,097,097 to Oster et al.; the compositions containing bichromated gelatin described in U.S. Pat. Nos. 2,484,451 and 2,500,028 to Griggs; the photodegradable polyolefin compositions described in U.S. Pat. No. 3,968,095 to Freeman et al.; compositions containing polymers having acid cleavable C—O—C groups as disclosed in U.S. Pat. No. 4,421,844 to Buhr et al. such as polyalkylaryl ethers disclosed in U.S. Pat. No. 4,435,496 to Walls et al.; compositions containing polyketones as described in U.S. Pat. Nos. 3,923,514 to Marsh and 4,419,506 to Nate et al. and by Tsuda et al. in U.S. Pat. No. 4,297,433; compositions containing polymethacrylate such as those described in U.S. Pat. Nos. 4,125,672 to Kakuchi and 3,779,806 to Gipstein et al.

Of the aforementioned depolymerizable systems, those which hold the most potential are those which combine an initiator which generates an acid upon exposure and an acid degradable polymer. For example, compositions employing initiators such as onium salts which undergo photolysis to produce strong acids which catalyze main chain scission of a polymer may be used. These systems are preferred to the others because a single photochemical event generates the acid which produces a number of bond transformations leading to complete or nearly complete reversion to the monomer. Included within this class of photodepolymerizable systems are compositions of acid degradeable polyaldehydes, polycarbonates and polyethers.

Another useful polymer is one which is crosslinked by an acid cleavable linking group. Expousre generates an acid as above which cleaves the linking group. Still another class of useful polymers are copolymers having acid degradable units or blocks in the polymer backbone.

The polyaldehydes which are useful in the present invention include poly(aromatic 1,2-dialdehydes), poly(aliphatic monoaldehydes), and copolymers thereof. These polymers undergo cationc depolymerization.

Polyaldehydes may be end-capped with a group which stabilizes the polymer to depolymerization. The end-capping group may be one which is photolabile nd which separates fromthe polymer directly upon exposure to radiation, or be one which is acid cleavable, such as an ester or an ether group, and which separates from the polymer in the presence of a photogenerated acid.

Alternatively, the polymer maybe sufficiently stable to be processable into the microparticle without end-capping.

Polycarbonates which are potentially useful in the present invention are described in the aforementioned papers of Crivello and Frechet. One useful polycarbonate is formed from the reaction of 2,5-dimethyl-2,5-hexanediol and 4,4-isopropyllidenediphenol.

Each microparticle includes an initiator which generates an acid, a cation, or a free radical which initiates depolymerization. The acid, cation, or free radical may be generated directly upon exposure or upon processing such as by heating. Where the system is silver catalyzed, a latent image in the form of the exposed silver halide may be formed and the cation generated subsequently upon heating or application of a developing agent. The initiator may b incorporated into the polymer chain, appended to the polymer chain, or simply mixed with the polymer.

Useful initiators for polyaldehydes include photogenerated acid precursors such as (i) triarylsulphonium hexafluorophosphates, triarylsulphonium arsenates and triarylsulphonium antimonates, (ii) diaryliodonium hexafluorophosphates, diaryliodonium arsenates and diaryliodonium antimonates, (iii) dialkyl-phenacylsulfonium tetrafluoroborates and dialkyl-phenacylsulfonium hexafluorophosphates, (iv) dialkyl-4-hydroxyphenylsulfonium tetrafluoroborates and dialkyl-4-hydroxyphenylsulfonium hexafluorophosphates. Other useful initiators include halogen-containing compounds such as carbon tetrabromide, hexachloroethane, tribromoacetophenone, etc. and diazo compounds such as diazonium salts and o-quinonediazides, etc.

The foregoing compounds may be used alone or in combination with a sensitizer. Useful sensitizers for diaryliodonium compounds include Acridine Orange, Acridine Yellow, Phosphine R, Benzoflavin and Setoflavin T. Anthracene, perlene, phenothiazine, 1,2-benzanthracene, coronene, pyrene, and tetracene are useful sensitizers for triarylsulphonium arsenates, diaryliodonium arsenates and dialkylphenacyl sulphonium compounds. Ketocoumarins are also useful sensitizers. These sensitizers are used in conventional amounts.

In accordance with one embodiment of the present invention, cationic depolymerization is photoinitiated using an initiator system including a silver halide, an organo-silver salt, and, optionally, a reducing agent. Examples of each are provided in U.S. Pat. No. 4,629,676. In the presence of the exposed silver halide, the silver salt releases an acid which initiates depolymerization.

Typical examples of silver salts useful in this embodiment of the present invention are silver behenate, silver alkanesulfonic acid salts, silver perfluoroalkanesulfonic acid salts, and silver $\beta$-hydroperfluoroalkanesulfonic acid salts. Examples are provided in U.S. Pat. Nos. 3,347,676 and 4,504,575. More specific examples are silver dodecylsulfonate, silver hexadecylsulfonate, silver trifluoromethylsulfonate, silver pentafluoroethylsulfonate, silver perfluoropropylsulfonate, silver perfluorooctylsulfonate, $(CF_3)_2CHCF_2SO_3Ag$, and n-$C_3F_7CFHCF_2SO_3Ag$.

Hydroquinones, m-dimethylaminophenol and m-diethylaminophenol, are useful reducing agents.

Conventional photographic silver halides are useful herein including silver chloride, silver bromide, silver iodide, silver chlorobromide, silver chloroidide, silver iodobromide, and silver chloroiodobromide, and, more particularly, silver halides associated with a sensitizing dye. These reactions are accelerated by heating after exposure.

The microparticles of the present invention can be used to control the release of various image-forming agents.

In a more preferred embodiment of the present invention, the microparticles can contain a benign visible dye and images are formed by contacting the exposed imaging material under pressure with a plain paper or a paper treated to enhance its affinity for the visible dye. A benign dye is a colored dye which does not interfere with the imaging photochemistry, (e.g., by relaxing the excited state of the initiator or detrimentally absorbing or attenuating the exposure radiation).

In another embodiment of the invention, images are formed through the reaction of a pair of chromogenic materials such as a color precursor and a color developer. In general, color precursors include colorless electrondonating compounds having in their partial skeleton a lactone, a lactam, a sultone, a spiropyran, an ester or an amido structure such as triarylmethane compounds, bisphenylmethane compounds, xanthane compounds, fluorans, thiazine compounds, spiropyran compounds and the like. These materials are conventionally used in carbonless paper. Crystal Violet Lactone, 2,6-diphenyl-4-(4'-dimethylaminophenyl)-pyridine, and Copikem X, IV, and XI are a few examples.

The foregoing compounds are acid developable and therefore inherently basic. As such, they may compete with the polymer for the photogenerated acid in certain embodiments. Another type of chromogenic material which may be preferred for use in the present invention is a base-developable chromogenic material. These materials are also leuco compounds and include the phenolphthaleins such as sulfobromophthalein sodium tetrahydrate, phenolphthalein, bromophenol blue, bromocresol green, bromocresol purple, and bromothymol blue.

In addition to carbonless paper-type color precursors, color photographic dye couplers can also be used as image-forming agents in accordance with the present invention. These materials may be developed using conventional phenolic or anilino photographic developers.

Diazonium salts are particularly useful image-forming agents because they react with unoxidized color couplers to provide azo dye images. Examples of useful diazonium salts are: 4-diazo-N,N-diethylamino fluoroborate, 2-methoxy-4-morpholino benzene-diazonium chloride zinc chloride double salt, (3-chloro-6-methoxylienzene diazonium chloride zinc chloride double salt, 2,5-dethoxy-4-benzoylamide-benzenediazonium chloride zinc chloride double salt, (4-chloro-2-methylbenzene diazonium chloride zinc chloride double salt, 5-nitrothiazole diazonium hexafluorophosphat, and 4-nitrobenzene diazonium hexafluorophosphate.

Useful couplers include: 1-naphthol, 2-naphtol, 3-methyl-1-phenyl-2-pyrazoline-5-one, 3-methoxyphenol, 4-methoxyphenol, 1,3,5,-trimethoxybenzene, 1,3,-dimethoxybenzene, 2,3,-dihydroxynaphtalene, 1,3-dihydroxynaphthalene, 1-methoxynaphthalene, 2-methoxynaphthalene, 2-($\alpha$-cyanoacetyl)benzofuran.

Examples of cyan, magenta and yellow image-forming dyes are disclosed in U.S. Pat. No. 4,500,624.

Illustrative examples of the developer materials conventionally employed in carbonless paper technology which are also useful electron donating color precursors in the present invention are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, zinc 3,5-di($\alpha$-methylbenzyl) salicylate, oil-soluble metal salts or phenol-formaldehyde novolak resins (e.g., see U.S. Pat. Nos. 3,672,935; 3,732,120; and 3,737,410) such as zinc-modified oil-soluble phenol-formaldehyde resin as disclosed in U.S. Pat. No. 3,732,120, zinc carbonate, etc., and mixtures thereof. Because these developers are acidic, in a self-contained system, they must be isolated from the microparticle. Otherwise, the developer may trigger undesirable depolymerization. One means to provide a self-contained material is to microencapsulate the developer in a separate microcapsule. The capsule containing the developer is then ruptured for development. Heatrupturable or pressure-rupturable capsules could be used.

To develop the base-developable chromogenic materials, weak bases such as sodium carboxylate or basic resins may be used.

Various methods can be used to form the microparticles of the present invention. A solution of the depolymerizable polymer and other additives (e.g., the initiator, sensitizer, and image-forming agent) in a water-miscible or a water immiscible solvent can be added to an aqueous solution of a stabilizing agent (e.g., an anionic, amphoteric or ionic surfactant such as sodium lauryl sulfate; pectin; or polyvinyl alcohol) under high sheer mixing and the dispersion coated on a support and the water removed through drying. Where the solvent used is immiscible in water, it is preferably removed prior to coating.

Alternatively, a polymer melt containing the other additives can be dispensed into an aqueous solution of an appropriate surfactant without a solvent and the dispersion coated on an appropriate support. Another method which can be used to form the microparticles is spray drying. In one useful spray drying technique, a solution of the polymer and additives is aspirated into a heated air space.

To prepare silver catalyzed microparticles, a silver halide emulsion (e.g., stabilized with polyvinylbutyral) containing an organo silver salt may be dispersed into a solution or melt of the depolymerizable polymer and the microparticles formed by either of the methods described above.

The composition of the microparticles used in the present invention will vary depending upon the nature of the photosensitive composition and the image-forming agent. In particular, in forming full color images, the composition of the mixture of microparticle will be adjusted to provide the appropriate color balance. Generally, microparticles in accordance with the present invention contain approximately 0.1 to 25 parts by weight of the image-forming agent per 100 parts by weight of the photosensitive composition and preferably 0.1 to 10 parts by weight.

A microparticle size should be selected which minimizes light attenuation. The mean diameter of the micrparticles used in this invention typically ranges from approximately 1 to 25 microns. As a general rule, image resolution improves as the size decreases. If the microparticles become too small, they may disappear in the pores of the fiber of the substrate. These very small microparticles may therefore be screened from exposure by the substrate. It has been determined that a preferred mean microparticle diameter range is from approximately 3 to 15 microns, and particular, 3 to 10 microns.

The most common substrate for use in this invention is paper. The paper may be a commerical impact raw stock, or special grade paper such as cast-coated paper or chrome-rolled paper. Alternatively, transparent substrates such as poly(ethylene terephthalate) can be used. Using a transparent substrate, the imaging material can be exposed from either the coated or uncoated side. A particularly preferred substrate is a thin transparent film.

The imaging materials of the present invention can be designed to provide monochromatic or full color images. Image processing techniques are desirably used to form full color images.

Figure 5:
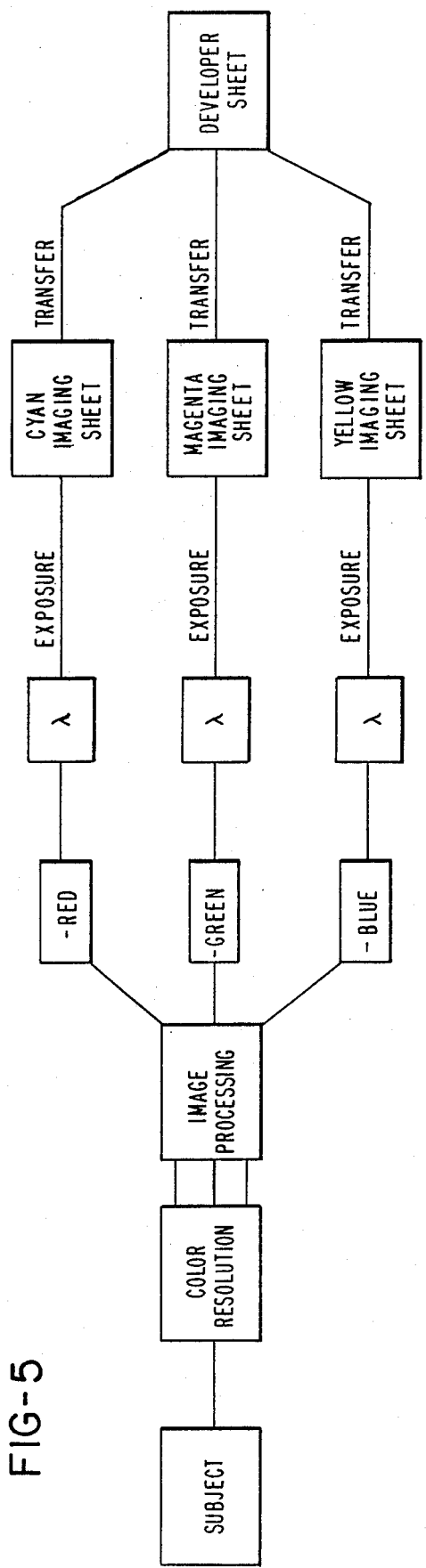
FIG. 5 is a block diagram illustrating one full color imaging process in accordance with the present invention.
Figure 6:
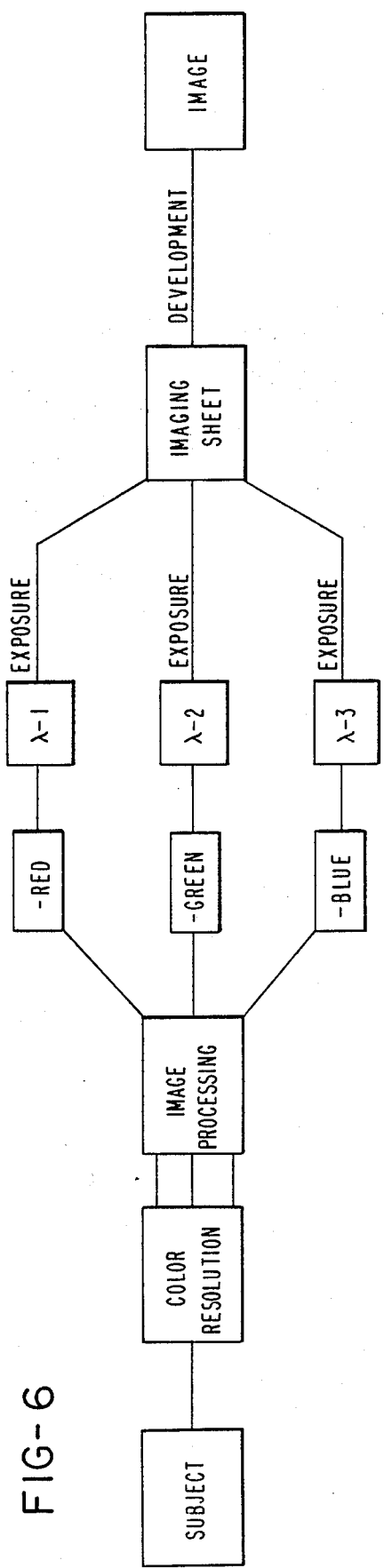
FIG. 6 is a block diagram illustrating another full color imaging process in accordance with the present invention.

FIGS. 5 and 6 are block diagrams illustrating two processes in accordance with the present invention for forming full color images. As shown in FIG. 5, a color original is resolved into its red, green, and blue component images. Because, in accordance with the most typical embodiment of the present invention, the photosensitive compositions are ultraviolet-sensitive or sensitive to blue or green light; the red, green, and blue component images are shown translated into radiation to which the microparticles are sensitive for exposure of three separate imaging sheets, each bearing microparticles which respectively contain cyan-, magenta-, and yellow-forming chromogenic materials. In accordance with this embodiment of the invention, apart from the chromogenic materials, the microparticles on the three imaging sheets can be identical. Thus, the red, green, and blue component images of the subject to be copied are inverted to produce reciprocal image information (i.e., −red, −green, and −blue) which are translated into the same wavelength band of actinic radiation.

As shown in FIG. 5, in addition to transforming the red, green, and blue component images into active radiation, image processing is used to correlate the component image with the exposure of the microparticles and the release of the image-forming agent. Since the microparticles are negative working, this involves an electronic inversion of the subject imge to produce the reciprocal image. Thus, in areas corresponding to the red image, the magenta and yellow color formers must be released to form a red image. In areas corresponding to the green image, yellow and cyan color formers must be released, and in areas corresponding to the blue image, cyan and magenta color formers must be released. To form full color images, an original may be viewed with a Dunn or matrix camera and the red, green and blue channel outputs electronically inverted to provide reciprocal red (−red), reciprocal green (−green), and reciprocal blue (−blue) image information. This information is then used to drive the radiation source such that the color formers are released by exposure of the three imaging sheets as described above.

In accordance with the foregoing embodiment of the invention, full color images are formed by transfer processing. Thus, each of the exposed imaging sheets is contacted in face-to-face registration with a developer sheet to form the full color image. As explained above, either directly as a consequence of exposure, or the combination of exposure and an additional treatment such as the application of heat or pressure, the microparticles image-wise release the chromogenic materials. Upon contact with the developer sheet, the cyan-, magenta-, and yellow-forming chromogenic materials are transferred to the developer sheet where they react to provide a full color image.

The more preferred method for forming full color images utilizes an imaging material in which the layer of microparticles is an admixture of three or four sets of microparticles respectively containing cyan-, magenta-, yellow-, and optionally, black-forming chromogenic materials. In accordance with this embodiment of the invention, the photosensitive compositions from which the microparticles are formed have distinctly different sensitivities to actinic radiation such that each set of microparticles can be exposed and caused to release the chromogenic material or become permeable to a developer without exposing the other sets of microparticles. In accordance with this embodiment of the invention, the microparticles may be formed from different photosensitive compositions containing different initiator systems. Imaging in accordance with this embodiment of the invention is shown in FIG. 6.

In FIG. 6, an original image is shown resolved into its red, green, and blue component images which, in accordance with the most typical embodiments of the invention, are processed (inverted) to produce reciprocal image information. In this embodiment, however, three exposure is at three wavelengths which are respectively indicated in FIG. 6 as λ-1, λ-2, and λ-3. In areas exposed to λ-1, the microparticles sensitive to λ-1 radiation release the cyan color precursor. The microparticles sensitive to λ-2 and λ-3 radiations, however, do not release the color precursors. In a parallel fashion, in areas exposed to λ-2, the microparticles sensitive to λ-2 release the magenta color precursor; whereas, the microparticles sensitive to λ-1 and λ-3 radiations do not. In areas exposed to λ-3 radiation, the microparticles sensitive to λ-3 radiation release the yellow color precursor; whereas, the microparticles sensitive to λ-1 and λ-2 radiation do not. In this manner, the microparticles image-wise release the color precursors and, upon development processing as described above, full color images are formed.

Color images can also be formed in accordance with the present invention by using negative color seps or separations. Each color sep is mounted on the imaging sheet and an exposure is made at one of the wavelengths to which the microparticles are sensitive.

When the imaging material employs silver initated microparticles, the imaging material is visible light sensitive. In this case, the imaging material may be exposed to visible light through a color negative to form full color positive images. Electronic image processing is not required.

The present invention will be illustrated in more detail by the following non-limiting Example.

EXAMPLE

Polyphthalaldehyde is prepared by the method of C. Aso and S. Tagami (Macromolecular Synthesis, *Collective Volume I*, J. A. Moore, ed., 505 (1977)). Generally polymerizations are done in a 250 ml round bottom three-necked flask equipped with septum, overhead stirrer and a nitrogen inlet/thermometer adapter. The reaction vessel is first purged with nitrogen with septum removed and dried with hot air gun until air temperature reaches 50° C. The reaction vessel is cooled, charged with phthalaldehyde (12.5 g). The septum is replaced and approximately 125 ml of methylene chloride, freshly distilled, is siphoned into the reaction vessel. The phthalaldehyde is dissolved and then cooled to dry ice-acetone temperatures. Some precipitation of monomer is always observed at this stage. With the solution stirring, $BF_3OEt_2$ catalyst in methylene chloride (1.3 to 1.4 percent on a molar basis of monomer) is added dropwise from a syringe. Some coloration is observed at this stage and precipitated monomer redissolves as polymerization proceeds. Polymerization at −75° C. is continued for three hours at slow stirring rates. The polymerization is quenched with dry pyridine (3 g) and warmed to room temperature. Polyphthalaldehyde is purified by repeated precipitation into two parts methanol using a Waring blender.

The microparticles are prepared by an emulsification technique. The typical solvent and water phase used is:

| | |
|---|---|
| Solvent phase | |
| Polyphthalaldehyde | 5.0 g |
| Diphenyliodonium hexafluorophosphate | 0.5 g |
| Isopropyl thioxanthone | 0.05 g |
| Methylene chloride | 50.0 g |
| Water phase | |
| Pectin | 2.5 g |
| Water | 100 g |

The solvent phase is added rapidly to the water phase with high speed stirring (T-Line Laboratory Stirrer, Model 104 rated at 7500 rpm.) using a three bladed propeller type stirrer. The size of the dispersion is checked to insure particles less than 10 microns in size. A fritted glass sparger with nitrogen is introduced to evaporate the methylene chloride solvent. This requires approximately 1.5 hrs. The microparticle suspension is coated as is with a number 12 Meier rod on paper and dried with an air gun. Scanning electron photomicrographs of the coated surface confirm the presence of microparticles. Coulter counter analysis of the emulsion solution gave results of a 3.4 micron average particle size (1.3 to 16 micron range).

The coated sheet is baked for 1 minute at 100° C.–120° C. A half-tone mask is placed over the sheet and exposed with a bank of three BLK-BP fluorescent bulbs (λmax−390 nm) for 8 sec. The imaged sheet is developed in a chamber saturated with ammonium hydroxide vapors to produce a negative of the original mask.

Having described the invention in detail and by reference to preferred embodiments thereof, it will be apparent that modifications and variations are possible without departing from the scope of the invention defined in the appended claims.

What is claimed is:

1. An imaging material comprising a support and a layer of photosensitive microparticles on one surface of said support, said microparticles including an image-forming agent and a photosensitive composition containing a polymer which is capable of undergoing cationically-initiated depolymerization and a photoinitiator including a silver halide and an organo silver salt, wherein, after exposing said microparticle to radiation, said microparticles, directly or with additional processing, release said image-forming agent or become permeable to a developer which reacts with said image-forming agent to form a visible image.

2. The imaging material of claim 1 wherein said polymer is a polyaldehyde.

3. The imaging material of claim 2 wherein said polyaldehyde is an poly(aromatic dialdehyde) or a poly(aliphatic aldehyde).

4. The imaging material of claim 3 wherein, after exposure, said microparticle releases said image-forming agent or becomes permeable to said developer by heating or by application of pressure following exposure.

5. The imaging material of claim 1 wherein said microparticles comprise a first set of microparticles containing a cyan image-forming material having a first wavelength sensitivity, a second set of microparticles containing a magenta image-forming material having a second wavelength sensitivity, and a third set of microparticles containing a yellow image-forming material having a third wavelength sensitivity, said first, second, and third sensitivities being sufficiently different that upon exposing said imaging material to a first radiation, substantially only said first microparticles release said image-forming material, upon exposing said imaging material to a second radiation different than said first radiation, substantially only said second set of microparticles release said image-forming material, and upon exposing said imaging material to a third radiation different than said first and second radiations, substantially only said third set of microparticles release said image-forming material.

6. The imaging material of claim 1 wherein said image-forming agent is a colored dye or pigment.

7. The imaging material of claim 1 wherein said image-forming agent is a chromogenic material and a developer material is associated with said imaging material which is capable of reacting with said chromogenic material and forming a visible image.

8. The imaging material of claim 5 wherein said first, second, and third radiation are respectively red, green and blue light.

9. The imaging material of claim 1 wherein said organosilver salt is selected from the group consisting of silver behanate, silver alkanesulfonic acid salts, silver perfluoroalkanesulfonic acid salts, and silver $\beta$-hydroperfluoroalkanesulfonic acid salts.

10. The imaging material of claim 9 wherein said organosilver salt is selected from the group consisting of silver dodecylsulfonate, silver hexadecylsulfonate, silver trifluoromethylsulfonate, silver pentafluoroethylsulfonate, silver perfluoropropylsulfonate, silver perfluoroctylsulfonate, $(CF_3)_2CHCF_2SO_3Ag$, and n-$C_3F_7CFHCF_2SO_3Ag$.

* * * * *